(12) United States Patent
Wong et al.

(10) Patent No.: US 7,242,261 B2
(45) Date of Patent: Jul. 10, 2007

(54) VOLTAGE CONTROL FOR CLOCK GENERATING CIRCUIT

(75) Inventors: Keng L. Wong, Portland, OR (US); Hong-Piao Ma, Portland, OR (US); Greg F. Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 10/680,498

(22) Filed: Oct. 6, 2003

(65) Prior Publication Data

US 2004/0070464 A1 Apr. 15, 2004

Related U.S. Application Data

(63) Continuation of application No. 10/136,318, filed on May 2, 2002, now Pat. No. 6,778,033.

(51) Int. Cl.
*H03B 1/00* (2006.01)

(52) U.S. Cl. .................. 331/185; 331/186; 327/291; 327/296; 327/539

(58) Field of Classification Search .............. 331/185, 331/186; 327/538, 539, 540, 564, 565, 291, 327/292, 293, 295, 296
See application file for complete search history.

(56) References Cited

U.S. PATENT DOCUMENTS

| | | | | |
|---|---|---|---|---|
| 5,430,397 A | * | 7/1995 | Itoh et al. | 326/101 |
| 5,764,710 A | * | 6/1998 | Cheng et al. | 375/371 |
| 5,796,992 A | | 8/1998 | Reif et al. | |
| 5,912,574 A | * | 6/1999 | Bhagwan | 327/157 |
| 5,999,025 A | * | 12/1999 | New | 327/156 |
| 6,127,880 A | * | 10/2000 | Holst et al. | 327/531 |
| 6,140,883 A | | 10/2000 | Thomas | |
| 6,201,448 B1 | | 3/2001 | Tam et al. | |
| 6,208,169 B1 | | 3/2001 | Wong et al. | |
| 6,268,749 B1 | | 7/2001 | Fisch et al. | |
| 6,298,450 B1 | | 10/2001 | Liu et al. | |
| 6,310,792 B1 | | 10/2001 | Drobnik | |
| 6,342,802 B1 | * | 1/2002 | Forehand | 327/198 |
| 6,366,154 B2 | * | 4/2002 | Pulvirenti | 327/525 |
| 6,529,421 B1 | * | 3/2003 | Marr et al. | 365/189.09 |
| 6,683,504 B1 | * | 1/2004 | Abernathy | 331/57 |
| 6,778,033 B2 | * | 8/2004 | Wong et al. | 331/185 |
| 2005/0083142 A1 | * | 4/2005 | Kim et al. | 331/167 |

OTHER PUBLICATIONS

Gyu Moon et al. "A New GHZ Cellular Oscillator Network" 1998 IEEE, pp. 11-89-92.

* cited by examiner

*Primary Examiner*—Timothy P. Callahan
*Assistant Examiner*—An T. Luu
(74) *Attorney, Agent, or Firm*—Blakely, Sokoloff, Taylor & Zafman LLP (57) ABSTRACT

An apparatus is provided that includes a clock distribution network, a plurality of distributed oscillators provided about the clock distribution network so as to provide clock signals on the clock distribution network and a power control circuit to control power applied to the plurality of distributed oscillators. The power control circuit includes a bandgap device to produce a reference voltage based on a desired power level and a comparing/decision device to receive the reference voltage from the bandgap device and to receive the voltage signal from a source external to the apparatus. The comparing/decision device determines whether the signal received from the power source corresponds to the desired power level.

20 Claims, 9 Drawing Sheets

VOLTAGE CONTROL FOR CLOCK GENERATING CIRCUIT

This is a Continuation Application of Ser. No. 10/136,318 filed May 2, 2002, now U.S. Pat. No. 6,778,033.

FIELD

The present invention relates generally to microprocessor circuits, and more specifically to internal clocks in microprocessor circuits.

BACKGROUND

Electronic devices, such as microprocessors, are steadily operating at faster and faster speeds. As microprocessors run at higher and higher speeds, the power delivered to the microprocessors by a power supply starts to become an issue. Voltage drops (or droops) may occur as power is delivered from a power source to individual components and devices on the die of a microprocessor. For example, devices on a die may receive only 1.0 volt from a power source that is supplying 1.2 volts due to a voltage droop. Decoupling capacitors may be used on a die to help reduce voltage droop. However, decoupling capacitors cost area on the die and also cost power due to gate oxide leakage.

Power source voltage droops affect the speed at which an electronic device (e.g., microprocessor or integrated circuit) may operate. During normal operation of a microprocessor (or any sequential machine), noise may be generated from instantaneous switching. Voltage supply noise modulates the delay of data paths. Voltage droops reduce the maximum frequency of operation of the microprocessor. For example, as a voltage droop magnitude increases, the operating frequency of the microprocessor decreases. Thus, a large change in processor activity may cause substantial supply voltage transients resulting in performance loss.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example arrangements and embodiments of the invention, it should be clearly understood that the same is by way of illustration and example only and that the arrangements and embodiments are not limited thereto.

The following represents brief descriptions of the drawings in which like reference numerals represent like element and wherein.

DETAILED DESCRIPTION

In the following detailed description, like reference numerals and characters may be used to designate identical, corresponding or similar components in differing figure drawings. Further, in the detailed description to follow, example values may be given, although embodiments of the present invention are not limited to the same. While values may be described as HIGH or LOW, these descriptions of HIGH and LOW are intended to be relative to the discussed arrangement and/or embodiment. That is, a value may be described as HIGH in one arrangement although it may be LOW if provided in another arrangement. Arrangements and embodiments may be shown in block diagram form in order to avoid obscuring the invention, and also in view of the fact that specifics with respect to implementation of such block diagram arrangements and embodiments may be highly dependent upon the platform within which the present invention is to be implemented. That is, such specifics should be well within the purview of one skilled in the art. Where specific details (e.g., circuits) are set forth in order to describe example embodiments of the invention, it should be apparent to one skilled in the art that the invention can be practiced without, or with variation of, these specific details. It should also be apparent that differing combinations of hard-wired circuitry may be used to implement embodiments of the present invention. That is, embodiments of the present invention are not limited to any specific combination of hardware.

Embodiments of the present invention may also be described with respect to signals being input or output from different circuit components. It is understood that while the discussion identifies a signal, the signal may be transmitted over a signal line or similar type of mechanism. Further, the terminology signal may also correspond to a signal line as shown in the drawings. Well-known power/ground and address connections to components may not be shown within the figures for simplicity of illustration and discussion, and so as not to obscure the invention.

While the following discussion may be presented with respect to implementation in a microprocessor, embodiments of the present invention are not limited to that specific implementation. Implementations for generating clock signals for various digital devices such as integrated circuits, discrete logic devices, memory devices, devices either on the same or separate chips, communications devices, etc., are all within the scope of the present invention.

In order to better describe embodiments of the present invention being pursued in the present patent application, various embodiments and arrangements may initially be described. These initial embodiments may be pursued in related U.S. patent application Ser. No. 10/136,390, filed simultaneously with this application.

Embodiments of the present invention may provide a circuit that includes a clock distribution network and a multiplexing device coupled to the clock distribution network to select between a synchronous mode and an asynchronous mode. A plurality of distributed ring oscillators may asynchronously drive the clock distribution network in the asynchronous mode. The distributed ring oscillators may be coupled to a power supply such that they track the critical paths. A phase lock loop circuit (located external to the core circuit) may synchronously drive the clock distribution network in the synchronous mode. In the following discussion, the terminology asynchronously driving the clock distribution network may be used with reference to the asynchronous mode. In the asynchronous mode, the clock distribution network may be driven asynchronously relative to an external clock. The clock distribution network may be synchronously driven although it is asynchronous with respect to an external clock.

Embodiments of the present invention may thereby provide power supply control on a microprocessor. This allows performance to be recovered since the performance may be dependent on the average power supply level rather than minimizing power supply droop. The core clock frequency may instantaneously track the worst-case speedpath over Vcc noise. The instantaneous performance of the processor core may vary over time in response to Vcc transient.

Figure 1:
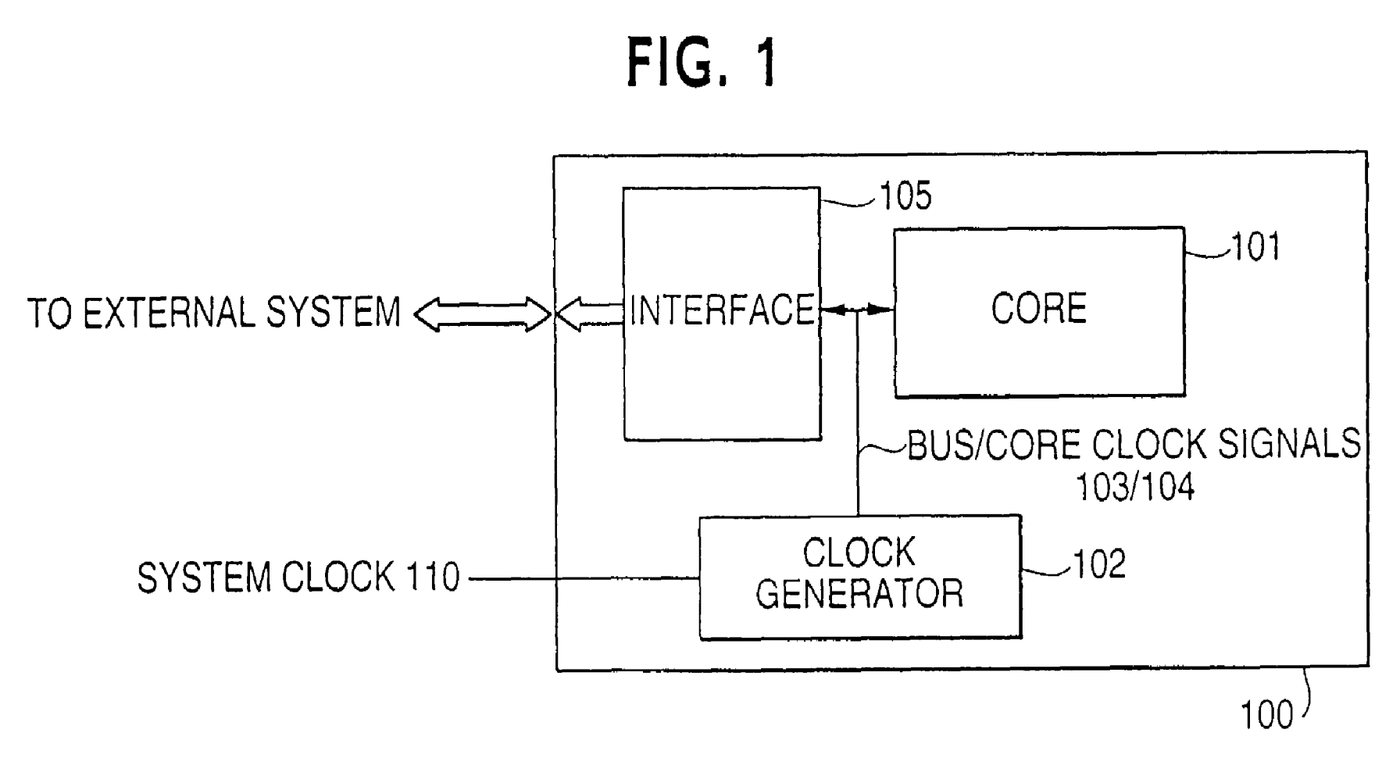
FIG. 1 is a block diagram of an integrated circuit according to one arrangement.

FIG. 1 is a block diagram of an integrated circuit according to one arrangement. Other arrangements are also possible. More specifically, FIG. 1 shows an integrated circuit 100 having a core 101, an interface 105, and a clock generator 102. The core 101 may include circuitry and logic to perform the designated functions of the integrated circuit, while the interface 105 may provide an interface between the core 101 and the remainder of the system and its system bus(es). For instance, if the integrated circuit 100 includes a processor, the core 101 may include one or more decoders, scheduling logic, execution units, reorder buffers, memory order buffers, register files, cache memory, etc., for use in executing instructions. The interface 105 may include external bus controller logic and programmable interrupt controller logic.

The clock generator 102 may generate the clock signals in response to a system clock signal 110. The clock generator 102 may include a phase lock loop (PLL) circuit. The clock signals may be coupled to the core 101 and the interface 105. The clock generator 102 may generate the bus clock signal(s) 103 and the core clock signal(s) 104.

Figure 2:
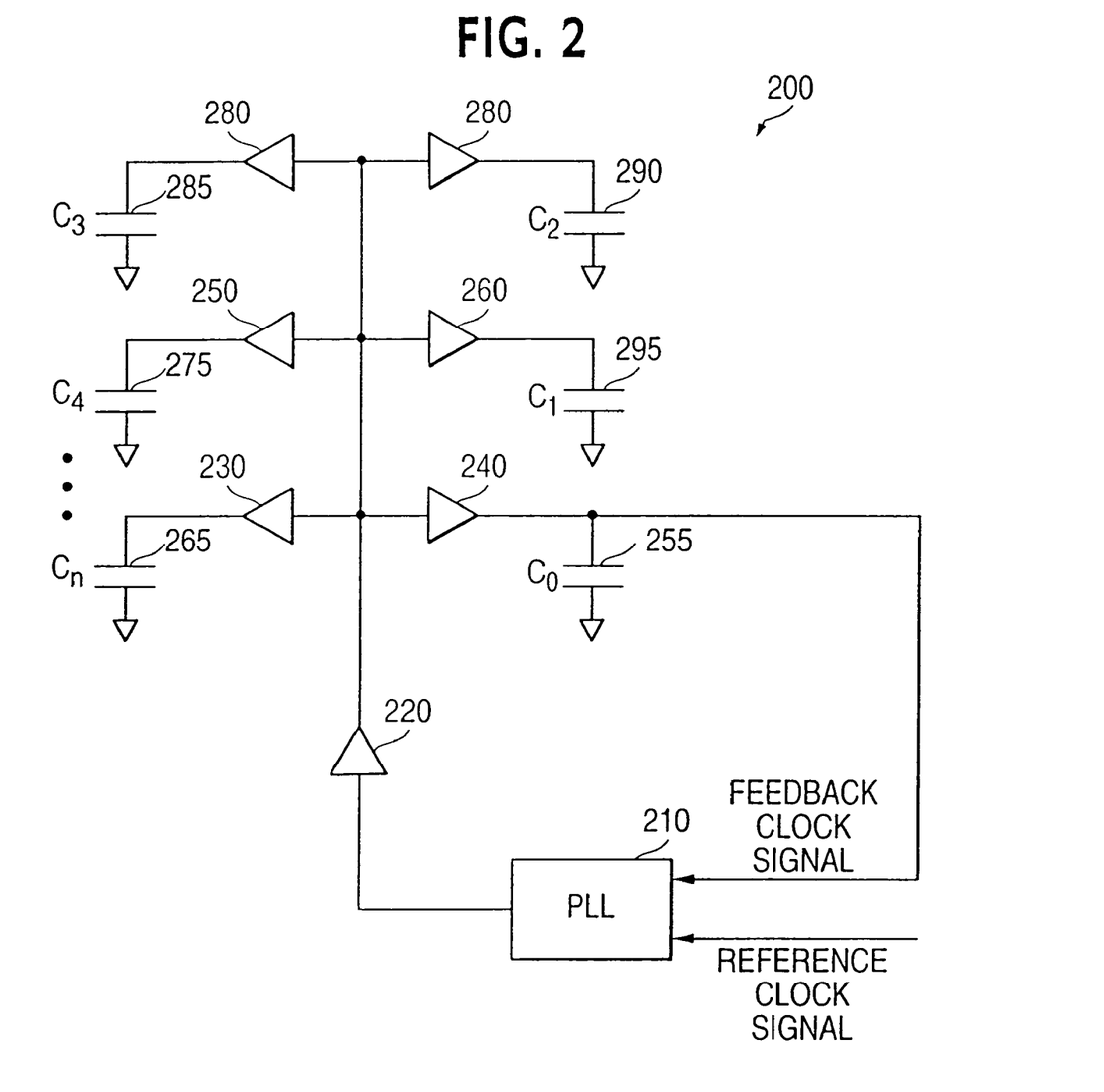
FIG. 2 is a schematic diagram of a clock distribution network according to one arrangement.

FIG. 2 illustrates a clock distribution network 200 according to one arrangement. Other arrangements are also possible. The clock distribution network 200 distributes a clock signal to chip components such as the core 101 (shown in FIG. 1). As illustrated, a feedback clock signal and a reference clock signal may be applied to a PLL 210, which may be provided within the clock generator 102. The clock distribution network 200 may include a plurality of drivers 220, 230, 240, 250, 260, 270 and 280 to drive large capacitances, such as attributable to registers and latches, with the output signal of the voltage-controlled oscillator of the phase lock loop (PLL). The drivers 220, 230, 240, 250, 260, 270 and 280 may contain inverters (not shown). Hence, the capacitances may be switched at the clock frequency. The capacitances 265, 275, 285, 290, 295 and 255 may be the capacitances attributable to the components of the chip. In addition to these capacitances, the gate capacitances of the driver inverters may also be switched at the clock frequency. If the total capacitance for the clock network is represented as C and the clock network switches at the clock frequency, f, the amount of power dissipated may be represented as $CV^2f$, where V is the supply voltage. This amount of power may be a significant portion of the total power utilized by the chip due to a relatively large C and a relatively high f.

Figure 3:
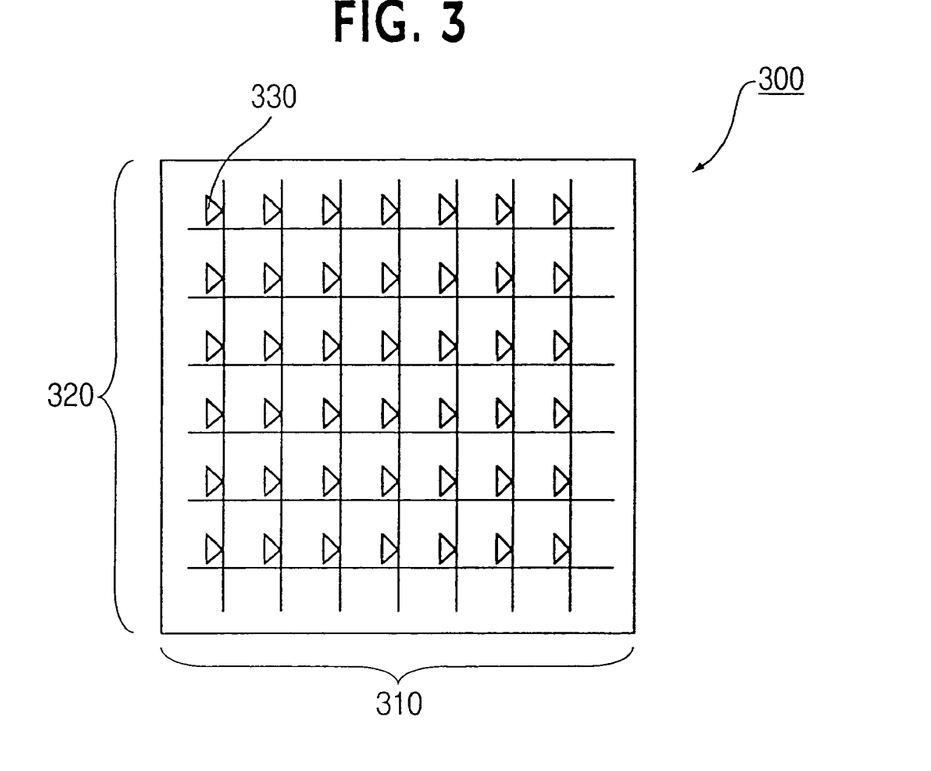
FIG. 3 is a diagram of one stage of a clock distribution network according to one arrangement.

FIG. 3 is a diagram of one stage of a clock distribution network according to one arrangement. Other arrangements are also possible. More specifically, FIG. 3 shows one stage of a clock distribution network 300 that may be provided within the core 101 (FIG. 1). FIG. 3 shows the terminal stage with multiple drivers driving a common and continuous grid. The clock distribution network 300 may also be provided within other entities. The core clock distribution network 300 may include signal traces 310 (shown vertically in the drawing figure) and signal traces 320 (shown horizontally in the drawing figure). The core clock distribution network 300 may also include a plurality of drivers coupled to the signal traces 310 and 320. For ease of illustration, only a first driver 330 is labeled in FIG. 3. The drivers operate to provide clock signals (such as core clock signals) to the clock distribution network 300 and thereby provide clock signals to respective elements (such as latches and registers) of the core 101 (not shown in FIG. 3).

Figure 4:
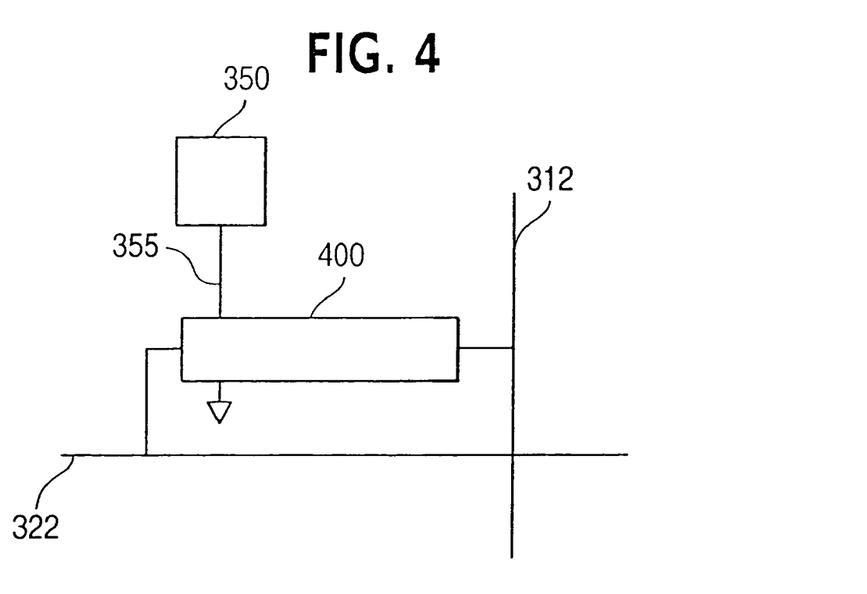
FIG. 4 is a block diagram of a clock generating circuit according to an example embodiment of the present invention.

FIG. 4 is a block diagram of a clock generating circuit according to an example embodiment of the present invention. Other embodiments and configurations are also within the scope of the present invention. In this embodiment, the clock generating circuit may be provided within the core 101 although the clock generating circuit may also be located in other locations that include a clock distribution network. More specifically, FIG. 4 shows a clock generating circuit 400 coupled between a first signal trace 312 and a second signal trace 322. The first signal trace 312 may be one of the signal traces 310 and the second signal trace 322 may be one of the signal traces 320. However, embodiments of the present invention are also applicable to the signal trace 312 and the signal trace 322 being configured into a clock distribution network different from the clock distribution network shown in FIG. 3. FIG. 4 only shows one clock generating circuit although the plurality of clock generating circuits may be distributed throughout the clock distribution network.

FIG. 4 also shows a power supply (or power supply device) 350 provided external to the core 101, such as in a periphery (i.e., the I/O) of the integrated circuit about the core 101 (FIG. 1). The power supply 350 may be coupled by a power distribution network 355 to the clock generating circuit 400. Although not shown in FIG. 4, a plurality of clock generating circuits 400 may be provided about the clock distribution network in a similar manner as each of the drivers provided about the clock distribution network 300 in FIG. 3. In other words, the clock distribution network may include a plurality of clock generating circuits 400 each coupled between signal traces and each powered by the power supply 350 through the power distribution network 355.

Figure 5:
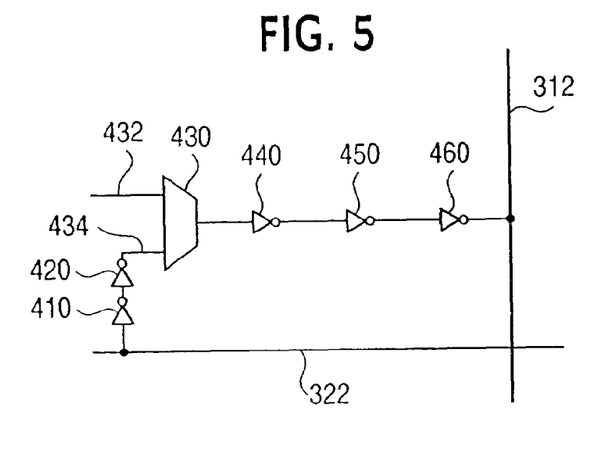
FIG. 5 is a diagram of a clock generating circuit according to an example embodiment of the present invention.

FIG. 5 is a diagram of a clock distribution circuit according to an example embodiment. FIG. 5 shows more specific circuit elements (such as inverter circuits and a multiplexing device) each of which may be powered by the power supply 350 coupled via the power distribution network 355. As shown, a plurality of inverter circuits 410, 420, 440, 450 and 460 and a multiplexing device 430 (or selecting device) may be coupled as a ring oscillator (or ring oscillator circuit) between the signal trace 312 and the signal trace 322. That is, the inverter circuit 410 receives a signal from the signal trace 322. The signal propagates through the inverter circuit 420, through the multiplexing device 430, through the inverter circuits 440, 450 and 460 and is output to the signal trace 312 from the last stage of the ring oscillator (such as the inverter circuit 460). In other words, the input signal to the ring oscillator and the output signal of the ring oscillator are to the clock distribution network.

FIG. 5 shows five stages of a ring oscillator circuit coupled between signal traces. The ring oscillator circuit may include any odd number of stages so as to produce an oscillating circuit between signal traces. That is, while FIG. 5 shows five inverter circuits, embodiments of the present application are also applicable to other numbers of inverter circuits coupled in series so as to produce a ring oscillator circuit. Furthermore, circuit elements other than inverter circuits may also be used to form the ring oscillator.

The multiplexing device (or selecting device) 430 is coupled between the inverter circuit 420 and the inverter circuit 440. The multiplexing device 430 selects between inputs on a signal line 432 and a signal line 434. The multiplexing device 430 may receive an input signal on the signal line 434 from the inverter circuit 420. The multiplexing device 430 may receive input signals on the signal line 432 from a phase lock loop (PLL) circuit provided external to the core 101, for example. That is, the phase lock loop circuit may provide a clock signal along the signal line 432 to the multiplexing device 430.

The multiplexing device 430 may receive a select signal to select between an asynchronous mode and a synchronous mode. In the synchronous mode, the clock signal on the signal line 432 passes through the multiplexing device 430, and subsequently passes through the inverter circuits 440, 450 and 460. The resulting signal is output to the signal trace 312 (i.e., the clock distributing network). This thereby results in the clock distribution network operating based on a synchronous signal provided by the PLL located external to the core 101. On the other hand, the multiplexing device 430 may operate in the asynchronous mode based on the select signal. In the asynchronous mode, the signal on the signal line 434 (from the inverter circuit 420) passes through the multiplexing device 430 and subsequently passes through the inverter circuits 440, 450 and 460. The resulting signal is output to the signal trace 312 (i.e., the clock distribution network). The signal may also propagate back along the signal trace 322 to the inverter circuits 410 and 420 and be subsequently passed through the multiplexing device 430 since the multiplexing device 430 is still operating in the asynchronous mode. Accordingly, the select signal applied to the multiplexing device 430 may operate the clock generating circuit in either a synchronous mode or an asynchronous mode. Although not shown in FIG. 5, each of the clock generating circuits provided about the clock distribution network may include elements (such as inverter circuits and multiplexing devices) similar to the elements shown in FIG. 5. Each of the respective multiplexing devices may separately receive a similar select signal so as to provide the appropriate mode for the entire clock distribution network.

The multiplexing device 430 may be considered part of the ring oscillator. The multiplexing device 430 may be a pass-through element, which makes it logically passive for the loop. However, the multiplexing device 430 may contribute to delay (and therefore period) and Vcc sensitively of the delay of the loop.

Figure 6:
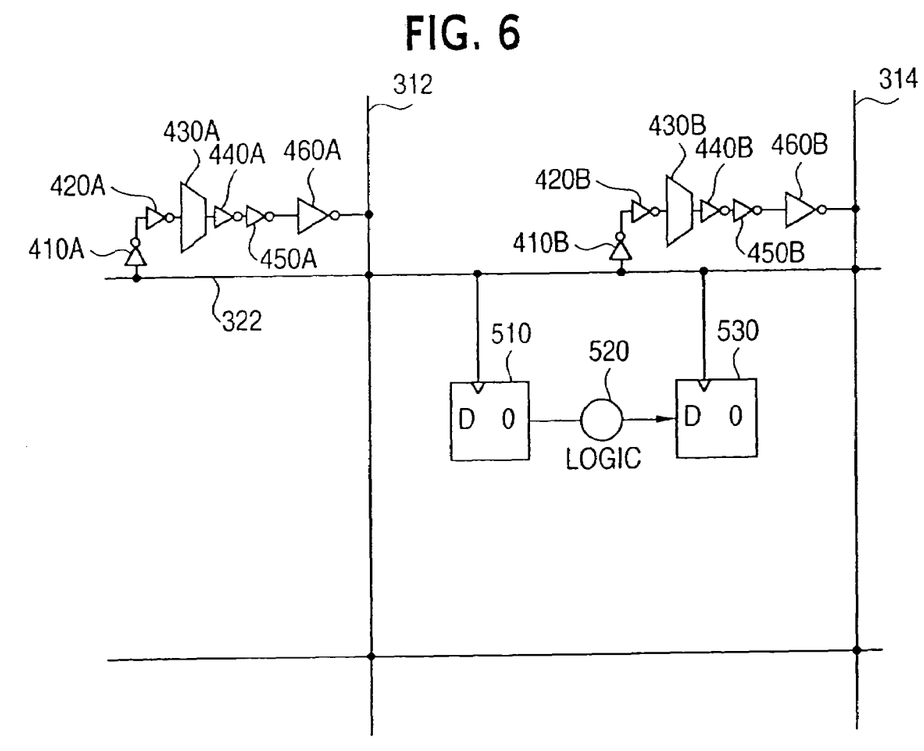
FIG. 6 is a diagram showing the clock generating circuit of FIG. 5 along with elements to be clocked according to an example embodiment of the present invention.

FIG. 6 is a diagram showing the clock generating circuit of FIG. 5 along with is elements to be clocked according to an example embodiment of the present invention. Other embodiments and configurations are also within the scope of the present invention. For ease of illustration, FIG. 6 only shows two clock generating circuits, namely a first clock generating circuit (in which the components are labeled A) and a second clock generating circuit (in which the components are labeled B). Both the first clock generating circuit and the second clock generating circuit may be similar to the clock generating circuit shown in FIG. 5 although other embodiments for a clock generating circuit are also within the scope of the present invention.

More specifically, the first clock generating circuit includes inverter circuits 410A, 420A, 440A, 450A and 460A as well as a multiplexing device 430A. Similarly, the second clock generating circuit includes inverters circuits 410B, 420B, 440B, 450B and 460B as well as a multiplexing device 430B. The first clock generating circuit may be coupled between the signal trace 312 and the signal trace 322. The second clock generating device may be coupled between a signal trace 314 (such as one of the signal traces 310) and the signal trace 322. FIG. 6 shows elements of the core 101 such as a D flip-flop circuit 510, logic 520 and a D flip-flop circuit 530. The D flip-flop circuits 510 and 530 may be clocked by the clock distribution network, such as clock signals on the signal trace 322. The logic 520 may include any type of latch, mechanism or state machine to perform a desired function in the core 101.

Figure 7:
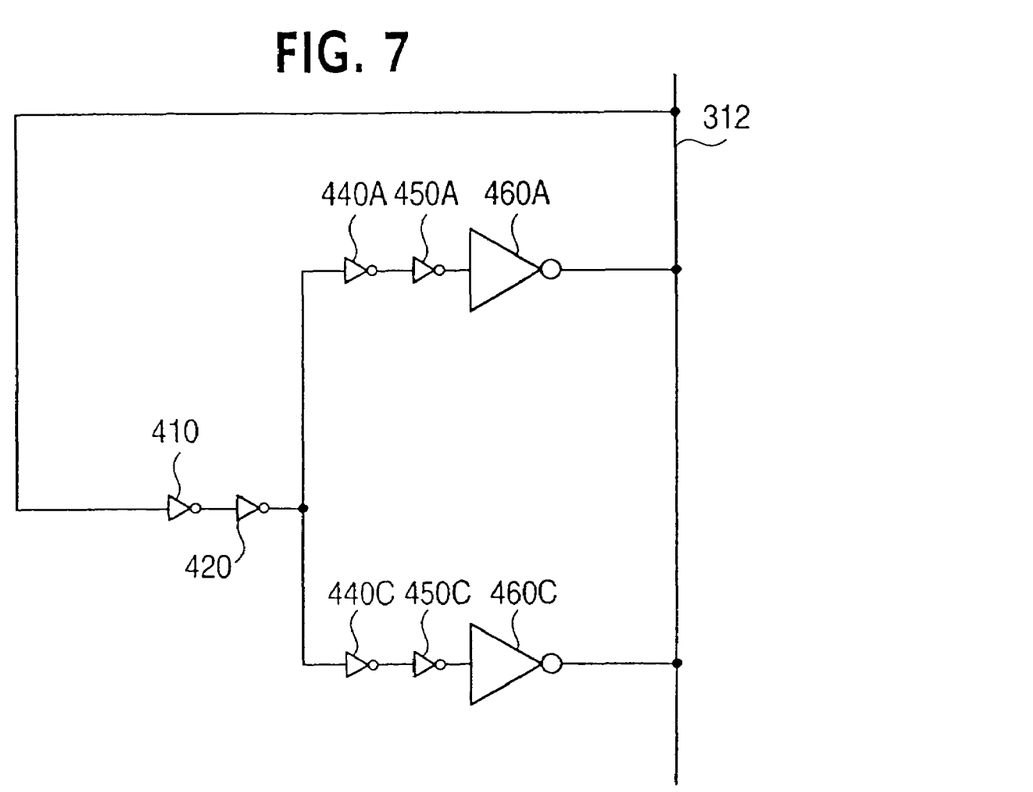
FIG. 7 is a diagram of a clock generating circuit according to an example embodiment of the present invention.

FIG. 7 is a diagram of a clock generating circuit according to an example embodiment of the present invention. Other embodiments and configurations are also within the scope of the present invention. In this embodiment, portions of the ring oscillator may be shared between a first clock generating circuit and a second clock generating circuit. More specifically, the inverter circuits 410 and 420 may be commonly used for both a first clock generating circuit (formed by at least the inverter circuits 440A, 450A and 460A) and a second clock generating circuit (formed by at least inverter circuits 440C, 450C and 460C). For ease of illustration, the multiplexing device for use in the ring oscillator is not shown in FIG. 7 although the multiplexing device may be provided after the inverter circuit 420 in one embodiment. The first clock generating circuit may output a clock signal on the signal trace 312 and the second clock generating circuit may output a clock signal on the signal trace 312.

Figure 8:
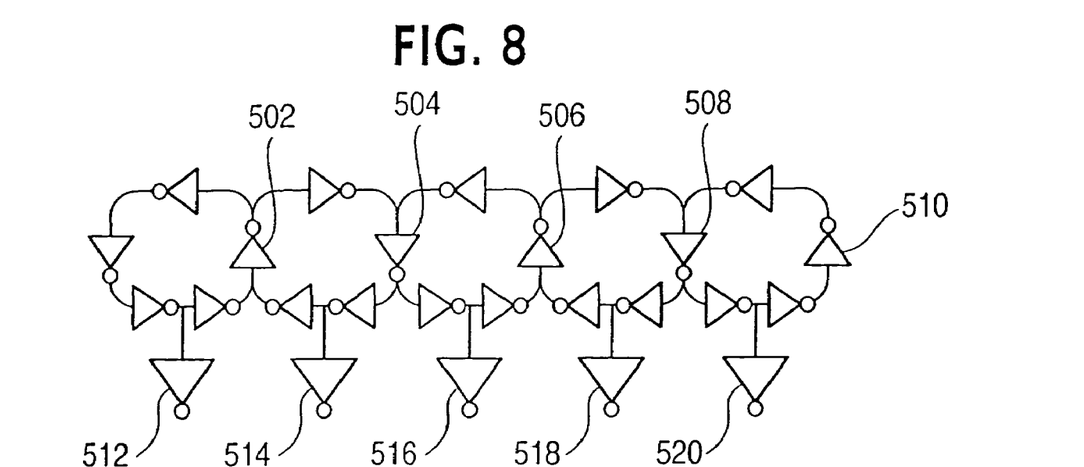
FIG. 8 is a diagram of a clock generating circuit according to an example embodiment of the present invention.

FIG. 8 is a diagram of a clock generating circuit according to another example embodiment of the present invention. Other embodiments and configurations are also within the scope of the present invention. In this embodiment, elements of the ring oscillator may be shared between clock generating circuits. In this embodiment, adjacent ring oscillators may be "horizontally" coupled to share elements such as inverter circuits. For example, each of inverter circuits 502, 504, 506, 508 and 510 are shared between adjacent ring oscillators. This may help reduce wire delays. The clock signals may be output from the last stage of each ring oscillator circuit to a signal trace such as the signal trace 322. In this example, inverter circuits 512, 514, 516, 518 and 520 are the last stage of each ring oscillator. Although not shown in FIG. 8, multiplexing devices may be provided prior to the last inverter circuit of each ring oscillator circuit.

Figure 9:
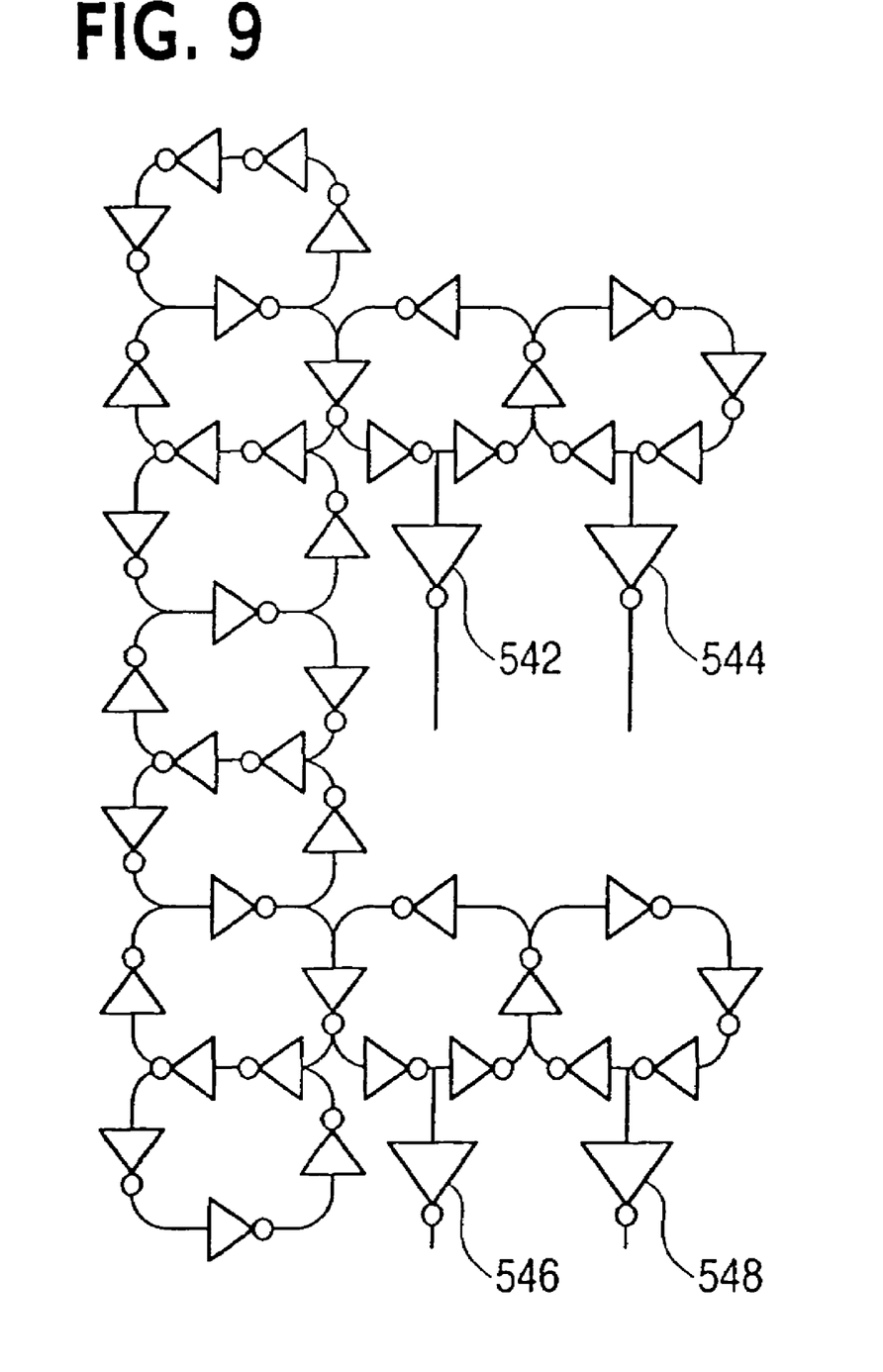
FIG. 9 is a diagram of a clock generating circuit according to an example embodiment of the present invention.

FIG. 9 is a diagram of a clock generating circuit according to another example embodiment of the present invention. Other embodiments and configurations are also within the scope of the present invention. In this embodiment, elements of the ring oscillators may be shared between clock generating circuits. In this embodiment, adjacent ring oscillators may be "horizontally" coupled to share elements. Ring oscillators may also be "vertically" coupled to share elements. The clock signals may be output from the last stage of the ring oscillator circuits to different signal traces. In this example, inverter circuits 542, 544, 546 and 548 are the last stage of each ring oscillator. Although not shown in FIG. 9, multiplexing devices may be provided prior to the last inverter circuit of each ring oscillator circuit.

As discussed above, the synchronous mode's signal may originate from a phase lock loop circuit located external from the core and be distributed with the clock distribution network. On the other hand, the asynchronous mode's signal may originate from itself. In a stopped state, all the ring oscillators may be de-asserted by an enable signal to one of the oscillator stages, which may be a NAND gate, for example. When an enable input is asserted high, then oscillation may begin. The enable signal to all the oscillators may be asserted simultaneously to start all the oscillators together.

Figure 10:
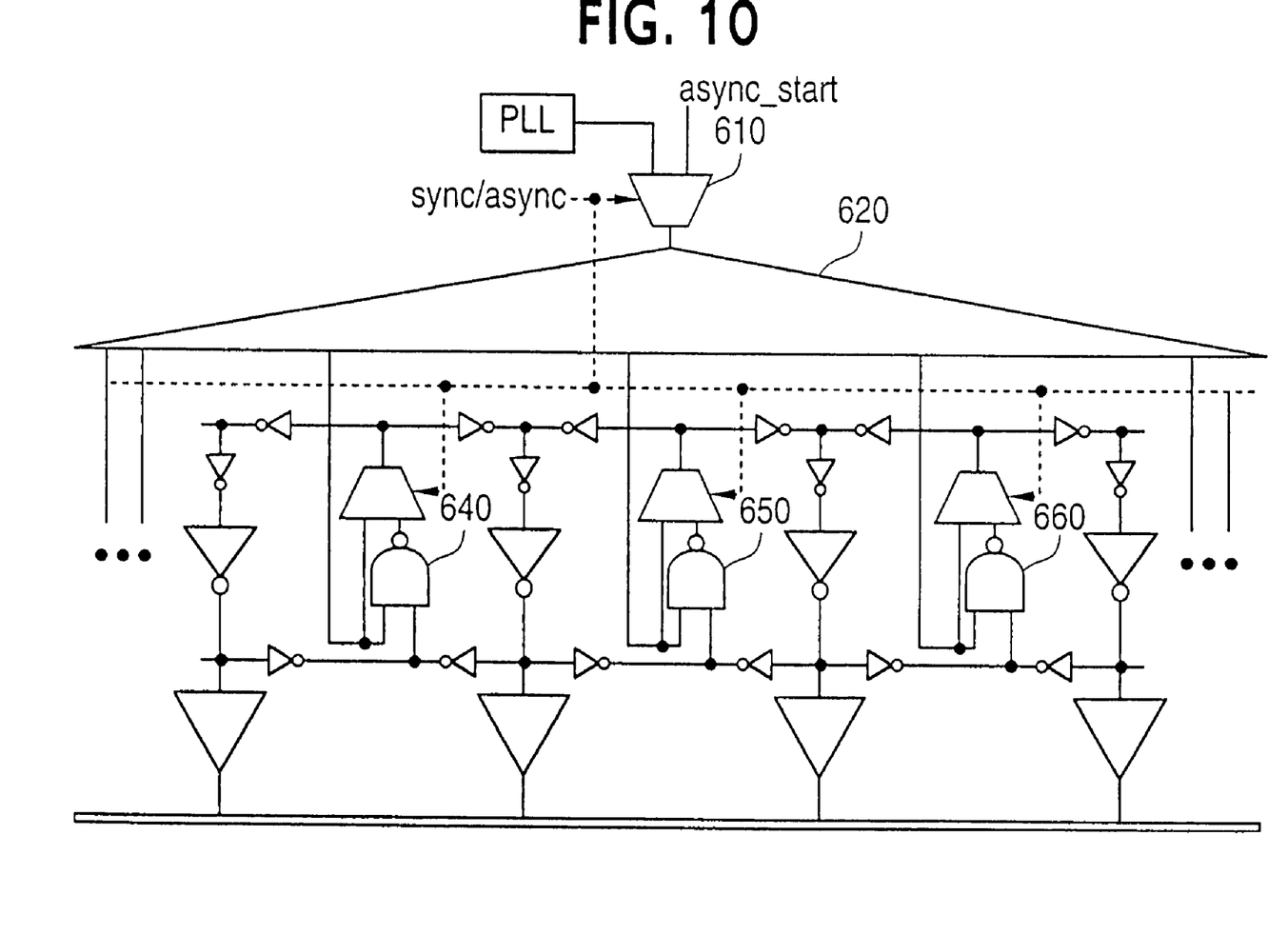
FIG. 10 is a diagram of a start/stop circuit according to an example embodiment of the present invention.

More specifically, FIG. 10 shows a start/stop circuit according to an example embodiment of the present invention. Other embodiments and configurations are also within the scope of the present invention. The start/stop circuit operates to start driving the clock distribution network and to stop driving the clock distribution network. FIG. 10 shows a multiplexing device 610 to select between a synchronous mode and an asynchronous mode based on a synchronous/asynchronous select signal, which is also used as the select signal for the multiplexing device of each of the ring oscillator circuits. FIG. 10 also shows portions of the clock distribution network 620 (such as respective signal traces) coupled to inputs of NAND gates 640, 650 and 660. Other inputs to the NAND gates 640, 650 and 660 may be from signal lines between stages of each ring oscillator circuit. The output of each of the NAND gates 640, 650 and 660 is to one input of the multiplexing device (such as the multiplexing device 430) of each ring oscillator circuit. Accordingly, the circuit shown in FIG. 10 provides start/stop capabilities in the asynchronous mode.

In the synchronous mode, the PLL may drive the clock distribution network, and the core clock. When the asynchronous mode is selected, then the clock distribution network may be driven by the asynchronous start signal (shown as async_start), which is initially low and thus the core clock may be stopped. The async_start signal may be asserted to start the asynchronous mode oscillator. Since this signal travels down the clock distribution network, a simultaneous start may occur. This may be the same for subsequent stops/starts.

Figure 11:
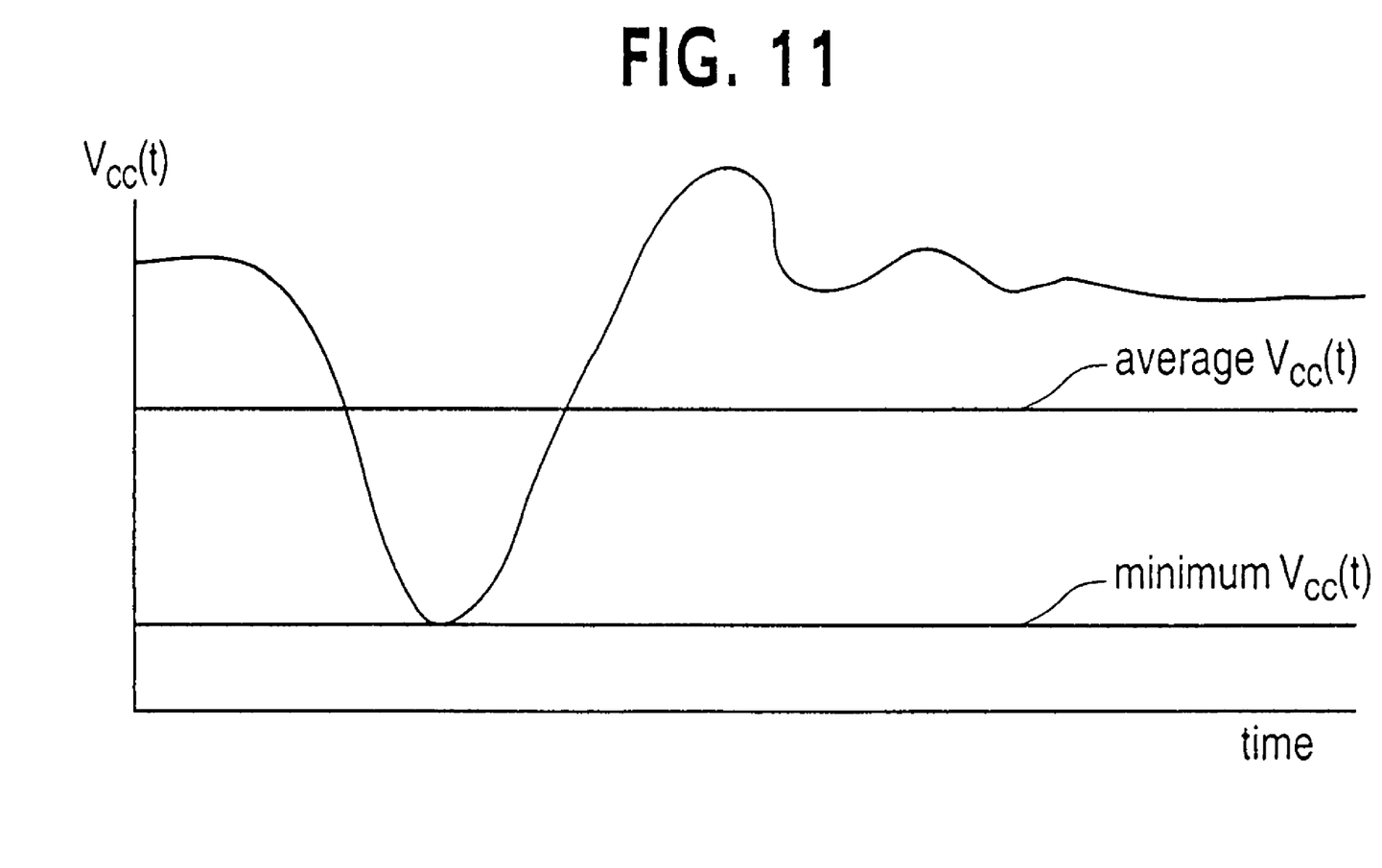
FIG. 11 is a graph showing a Vcc voltage signal that varies due to noise.

FIG. 11 is a graph showing the Vcc voltage signal on a die. As shown, the Vcc signal may vary due to reasons such as noise. The noise may impart Vcc modulation with peaks and valleys. FIG. 11 also shows a minimum Vcc(t) value that is located at a value no greater than the largest valley of the Vcc signal. In this arrangement, the frequency of the core would be at the lowest Vcc droop. Embodiments of the present invention allow the die to operate at an average Vcc(t) value. That is, the frequency of the core may track Vcc instantaneously. As clearly shown in FIG. 11, the average Vcc(t) value is higher than the minimum Vcc(t) value. This allows the performance to be based on the average power supply level rather than the minimum power supply level. This also reduces the need to minimize the power supply droop as in disadvantageous and costly arrangements.

Embodiments of the present invention have been described with regard to a method and apparatus to couple a core frequency to an instantaneous power supply such that the core frequency tracks the power supply (Vcc) to maintain functionality of the core logic in the face of severe supply noise. Embodiments of the present invention may include distributed oscillators to drive a common clock distribution network. The distributed oscillators may filter out the uncorrelated noise and respond to global supply noise. Embodiments of the present invention may further provide an asynchronous core I/O interface flexible enough to allow a wide range of instantaneous frequency ratios between the core and the I/O. An I/O ring around the core may run on a phase lock loop circuit synchronizing the I/O to the external world and thereby presenting a synchronous interface to the outside. An internal core phase lock loop circuit may drive the internal core clock in a synchronous mode to facilitate testing.

Embodiments of the present invention may provide a clock distribution network driven by a regular array of identical oscillators. This uniform structure may ensure that all the oscillators toggle simultaneously to produce a clock that reaches any point on the die at a coherent frequency with minimal skew between points. Each oscillator may include a ring oscillator made out of an odd number of inversion is stages. These stages may be CMOS technology so that the elements of the ring oscillator track the power supply and temperature in the same fashion as the core datapath logic. The ring oscillator length may also be adjustable. The ring oscillator may be adjusted to a length that produces a period just long enough to ensure functionality of the worst-case core speedpath under any power supply and temperature condition. As Vcc-Vss increases, the worst speedpath may need less time to evaluate, and the oscillator frequency may proportionately increase to keep track. On the other hand, as Vcc-Vss decreases, the worst speedpath may require more evaluation time and that increase in time is provided by the slower oscillator frequency. As a result, the instantaneous oscillator frequency may track the worst speedpath, thus ensuring functionality over any (voltage, temperature) condition. Some amount of margin may counter any locally uncorrected noise in voltage and temperature.

One alternate mode may employ the PLL as a clock source. This allows testing of the microprocessor in the traditional synchronous mode, in which machine behavior is predictable on a cycle-by-cycle basis.

The proceeding arrangements and embodiments have been described in U.S. patent application Ser. No. 10/136, 390, filed simultaneously with this application. The following embodiments may be pursued in this patent application, although these embodiments are also applicable and combinable with the embodiments and features described above.

As discussed above, a regular clock distribution network may be driven by a regular array of identical oscillators. Each oscillator may be a ring oscillator that includes an odd number of inversion stages. These stages may be made of CMOS technology so that the components track power supply and temperature in the same fashion as the core datapath logic.

Processors and other products may be specified for a certain power supply level in order to guarantee acceptable reliability. A higher voltage supply results in a higher frequency. Unfortunately, too high a voltage supply may result in an accelerated lifetime (i.e., shorter product life). It may be tempting for users to tamper with a voltage regulator module (VRM) on the motherboard so as to increase the voltage supply. A voltage level of the VRM may be controlled by a voltage identification (VID) code emitted from the processor (or core). The VID code may be bypassed on the motherboard such as on the core-VRM link.

In order to avoid this problem, the power supply level received by the processor (or core) may be checked against the VID code within the core (i.e., on-die). For example, a bandgap reference voltage may be produced. By comparing the power level on-die (with appropriate filtering) against the bandgap reference voltage (or a fraction thereof), the integrity of the core-VRM link may be verified.

Embodiments of the present invention may limit or control the Vcc voltage (and hence the core clock frequency) in an asynchronous core design. This may allow the checking of the applied supply voltage from the VRM. This checking may counter remarking or tampering of processors.

Figure 12:
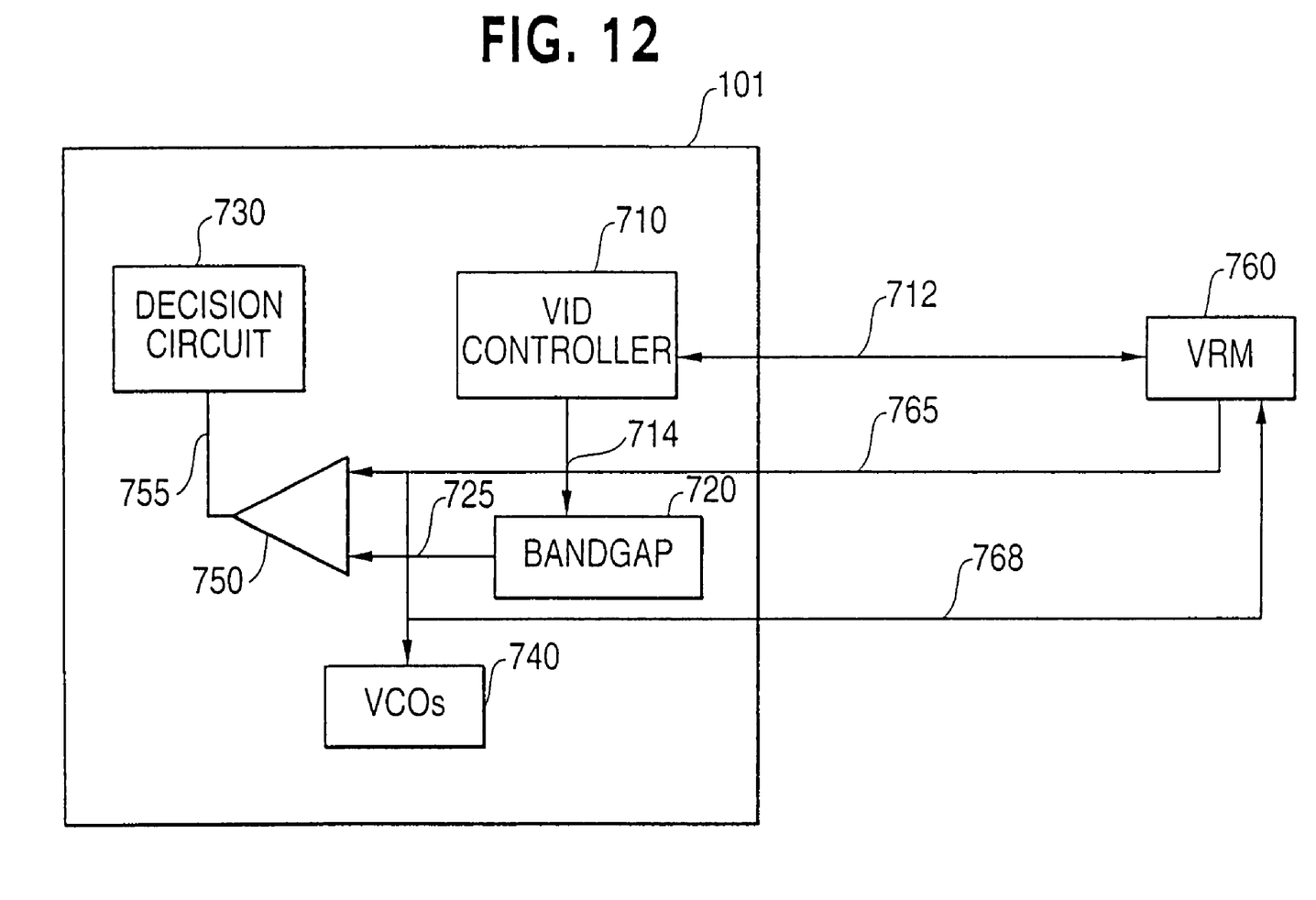
FIG. 12 is a diagram of a voltage control circuit according to an example embodiment of the present invention.

FIG. 12 is a diagram of a voltage control circuit according to an example embodiment of the present invention. Other embodiments and configurations are also within the scope of the present invention. More specifically, FIG. 12 shows a processor core such as the core 101 shown in FIG. 1. The core 101 may include a voltage identification (VID) controller 710, a bandgap device 720, a comparing device 750, a decision device 730 and a plurality of voltage controlled oscillators (VCOs) 740. The VCOs 740 may correspond to the ring oscillators provided about the clock distribution network as described above. The VCOs 740 may be coupled to the voltage control circuit (or power control circuit) via a power distribution network (such as the power distribution network 355 shown in FIG. 4).

The voltage control circuit may monitor the voltage that is applied to the VCOs 740 via the power distribution network so as to determine that the VCOs 740 are being properly powered. As described above, the performance of the VCOs 740 may be very sensitive to the environment such as temperature and voltage. That is, if the voltage applied to the VCOs 740 is too high, then the core clock may run too fast.

The VID controller 710 may output a digital code along a signal line 712 to the VRM 760 and along a signal line 714 to the bandgap device 720. The VRM 760 may be located external to the core 101 and external to the integrated circuit. The bandgap device 720 may be located within the core 101. The same VID code (or digital code) may be applied to both the VRM 760 and the bandgap device 720 although a different code may also be provided to the respective devices. Multiple power-performance levels may be achieved by adjusting the VID code, which is an indication to the VRM 760 of the voltage level to supply the processor. The digital code may specify a voltage that should be applied via the power distribution network to the VCOs 740. Based on the digital code received along the signal line 712, the VRM 760 may supply the appropriate voltage (hereafter called the Vcc voltage) to the core. The Vcc voltage may be applied along signal line 765 to one input of the comparing device 750. On the other hand, based on the digital code received along the signal line 714, the bandgap device 720 may supply a reference voltage along a signal line 725 to another input of the comparing device 750. The comparing device 750 may compare the reference voltage with the externally supplied voltage to determine if the proper voltage is being supplied.

Embodiments of the present invention may monitor the VCC voltage level by use of the bandgap device 720 and the comparing device 750. More specifically, the comparing device 750 may compare the reference voltage (from the bandgap device 720) with the received Vcc voltage (from the VRM 760). One skilled in the art would understand that the value actually compared within the comparing device 750 may be a divided value based on the respective inputs. That is, the comparing device 750 may be an analog voltage comparator that compares an internally generated reference (derived from the bandgap reference voltage) versus the externally applied voltage (Vcc). Further, the bandgap device 720 outputs a voltage that is constant over temperature and supply voltage. The comparing device 750 may output a result of the comparison along a signal line 755 to the decision device 730, which may make an appropriate decision based on the received signal(s). That is, the decision device 730 may determine if the voltage being received along the signal line 765 (from the VRM 760) corresponds to the reference voltage along the signal line 725 (from the bandgap device 720) on the signal line 725. Based on this decision, the decision device 730 may allow the processor core to continue running or the decision device 730 may shut down the processor core because an improper external voltage is being supplied. The Vcc voltage may be supplied to the VCO 740 via the power distribution network (shown in FIG. 12 as signal line 770) as discussed above. The VRM 760 may also receive a sense signal (or feedback signal) along a signal line 768 indicative of the voltage reaching the VCOs 740.

Signals sent along the signal line(s) 712 from the VID controller 710 to the VRM 760 may be parallel signals (such as 5 bits, for example). Signals may also be serially sent along the signal line 712. Serial VID is described in U.S. patent application Ser. No. 09/895,062, filed Jun. 29, 2001. A serial interface may save channel width, and also allow protocol (handshake) and encryption (security) methods to be deployed to further reduce the possibility of tampering.

The VID controller 710 may be a digital circuit on-die that decides on the VID code to drive the VRM 760. A VID table may specify the digital code versus the analog Vcc voltage to be supplied by the VRM 760. The processor may decide which VID to send to the VRM 760.

For an asynchronous core design, on-die sensing of the voltage level may be employed in order to cancel out any DC drop due to package and motherboard parasitic resistance. This may allow an accurate comparison of the VID against the supplied voltage, as well as having a significant performance advantage. Since an asynchronous core design allows quite a bit of AC parasitics without losing performance, the AC and DC characteristics of power delivery may be decoupled. By using DC sensing from the die, the DC loss may be ignored. This may further simplify package/motherboard design and cost without losing performance.

Embodiments of the present invention have been described with respect to a clock generating circuit, a clock distribution network and a power distribution network. The clock distribution network is intended to include clock distribution grids and clock distribution trees and their equivalence. The power distribution network is intended to include power distribution grids and power distribution trees and their equivalence. The clock generating circuit may be provided in areas (other than the core) that include any type of clock distribution network.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A voltage control circuit comprising:
   a bandgap device to produce a reference voltage based on a particular power level;
   a plurality of distributed oscillators powered by a voltage signal from a power source; and
   a decision device to receive the reference voltage from the bandgap device and to receive the voltage signal from the power source, the decision device to determine whether the voltage signal received from the power source corresponds to the particular power level.

2. The circuit of claim 1, wherein the decision device comprises a comparing device to compare values associated with the reference voltage and the voltage signal, and to output a result signal based on the comparison.

3. The circuit of claim 2, wherein the decision device further comprises a decision mechanism to receive the result signal output from the comparing device and to make a decision regarding operation of the power source.

4. The circuit of claim 2, wherein the decision comprises determining that the voltage signal is not at or above the particular power level.

5. The circuit of claim 1, wherein the voltage control circuit is provided within a core of an integrated circuit.

6. The circuit of claim 5, wherein the voltage signal is provided by a voltage regulating device located external to the core.

7. An apparatus comprising:
   a clock distribution network;
   at least one oscillator coupled to the clock distribution network so as to provide a clock signal on the clock distribution network; and
   a power control circuit to control power applied to the at least one oscillator, the power control circuit including:
      a bandgap device to produce a reference voltage based on a particular power level; and
      a decision device to receive the reference voltage from the bandgap device and to receive a voltage signal from a power source external to the apparatus, the decision device to determine whether the voltage signal received from the power source corresponds to the particular power level.

8. The apparatus of claim 7, wherein the decision device comprises a comparing device to compare values associated with the reference voltage and the voltage signal, and to output a result signal based on the comparison.

9. The apparatus of claim 8, wherein the decision device further comprises a decision mechanism to receive the result signal output from the comparing device and to make a decision regarding operation of the power source.

10. The apparatus of claim 8, wherein the decision comprises determining that the voltage signal is not at or above the particular power level.

11. The apparatus of claim 7, wherein the power control circuit is provided within a core of an integrated circuit.

12. The apparatus of claim 11, wherein the voltage signal is provided by a voltage regulating device located external to the core.

13. An apparatus comprising:
    a processor core having a voltage control circuit and at least one oscillator to produce core clock signals; and
    a power source located external to the core to provide power to the at least one oscillator based on a signal received from the processor core,
    the voltage control circuit including:
       a first device to produce a reference signal indicative of a particular power level to provide acceptable reliability of the processor core and to power the at least one oscillator; and
       a second device to receive the reference signal and to receive a signal from the power source, the second device to determine whether the signal received from the power source corresponds to the particular power level.

14. The apparatus of claim 13, wherein the second device comprises a comparing device to compare values associated with the reference signal and the signal received from the power source, and to output a result signal based on the comparison.

15. The apparatus of claim 14, wherein the second device further comprises a decision mechanism to receive the result signal output from the comparing device and to make a decision regarding operation of the power source.

16. The apparatus of claim 15, wherein the decision comprises determining that the signal from the power source is not at or above the particular power level.

17. An apparatus comprising:
    a processor core having a voltage control circuit and at least one oscillator to produce core clock signals; and
    a power source located external to the core to provide power to the at least one oscillator based on a signal received from the processor core, the voltage control circuit including:
       a first device to produce a reference signal indicative of a particular power level to provide acceptable reliability of the processor core and to power the at least one oscillator; and
       a second device to receive the reference signal and to receive a signal from the power source, the second device to determine whether the signal received from the power source corresponds to the particular power level; and
    a device to provide a first code and a second code based on the particular power level, the reference signal being produced based on the first code.

18. The apparatus of claim 17, wherein the signal received from the power source is based on the second code.

19. The apparatus of claim 17, wherein the first code is identical to the second code.

20. The apparatus of claim 17, wherein the first code is different than the second code.

* * * * *